United States Patent [19]
Miyazawa

[11] Patent Number: 5,499,929
[45] Date of Patent: Mar. 19, 1996

[54] SOCKET CONNECTOR FOR ELECTRONIC DEVICES

[75] Inventor: Shuichi Miyazawa, Yamanashi, Japan

[73] Assignee: Kel Corporation, Tokyo, Japan

[21] Appl. No.: 257,863

[22] Filed: Jun. 10, 1994

[30] Foreign Application Priority Data

Jun. 11, 1993 [JP] Japan .................... 5-166413

[51] Int. Cl.⁶ .................................. H01R 13/62
[52] U.S. Cl. ............................. 439/331; 439/71
[58] Field of Search ................ 439/68–73, 330, 439/331, 525, 526

[56] References Cited

U.S. PATENT DOCUMENTS

| | | | |
|---|---|---|---|
| 4,969,828 | 11/1990 | Bright et al. | 439/68 |
| 5,059,129 | 10/1991 | Brodsky et al. | 439/71 |
| 5,131,852 | 7/1992 | Grabbe et al. | 439/68 |
| 5,161,983 | 11/1992 | Ohno et al. | 439/71 |
| 5,221,209 | 6/1993 | D'Amico | 439/71 |
| 5,273,440 | 12/1993 | Ashman et al. | 439/71 |

Primary Examiner—Gary F. Paumen
Assistant Examiner—Hien D. Vu
Attorney, Agent, or Firm—Robert W. J. Usher

[57] ABSTRACT

A connector for mounting an LGA device on a circuit board comprises a film contact having electrode bumps on inner ends of respective conductive paths at predetermined spaced apart locations corresponding to respective locations of the individual electrode lands on the LGA device and is clamped extending across a central cavity defined between housing base and frame members. A flat elastomeric biassing pad having a series of upstanding, closely spaced resilient projections is retained by the base member in the cavity with the projections supporting spaced apart locations of one surface of the film contact while a cover member retains the device in the cavity in the frame member with the respective lands thereof pressed against respective electrode bumps, compressing the biassing pad to assure sufficient contact pressure. The cover member has a camming detent which progressively engages the device during closing, moving the device across the film contact with a wiping action.

11 Claims, 13 Drawing Sheets

SOCKET CONNECTOR FOR ELECTRONIC DEVICES

FIELD OF THE INVENTION

The invention concerns a socket connector for mounting electronic devices, particularly integrated circuits (ICs and LSIs) of the LGA (land grid array) type, on circuit boards.

BACKGROUND OF THE INVENTION

In electronic devices of the LGA type, numerous individual electrode lands or pads are provided on a lower, contact surface enabling a significant, advantageous reduction in the height of the entire device by comparison with electronic devices of the PGA (pin grid array) type, which employ numerous electrode pins.

The socket connector which is required to mount, LGA-type devices on circuit boards should therefore minimize the above-board mounting height to take full advantage of the low profile of the LGA-type device.

However, socket members have previously employed elastomeric interface connectors in which numerous contact pins, wires or filaments are embedded, distributed in spaced apart relation, in a sheet or pad of elastomer which requires a relatively difficult manufacturing operation. Furthermore, the same elastic properties of the elastomer which are relied on for providing a suitable contact pressure may also result in the contact pins being displaced towards the inside of the sheet with consequential difficulty in obtaining reliable electrical connections with all the electrode lands of the device.

SUMMARY OF THE INVENTION

An object of the invention is to provide a socket connector for electronic devices of the above type which is relatively simple to manufacture and which can afford a sufficiently low profile while establishing reliable electrical connection with respective electrode lands.

According to one aspect, the invention provides a socket connector for mounting an electronic device of a type having a series of individual electrode lands at predetermined spaced apart locations on a lower, contact surface thereof, on a circuit board comprising a film contact comprising an insulating film having upper and lower surfaces and carrying a series of conductive paths with respective board connecting portions extending away from respective individual contact end portions which are located on the upper surface at predetermined spaced apart locations corresponding to the respective locations of the individual electrode lands; base means located under the lower surface of the film contact in supporting relation thereto; a resiliently compressible biassing sheet located on the base means so as to underlie at least the contact end portions of the film contact; and, cover means for engagement with an upper surface of the electronic device to retain the electronic device pressed against the upper surface of the film circuit with resilient compression of the biassing sheet urging respective individual contact end portions of the conductive paths against respective individual electrode lands with sufficient contact pressure to ensure reliable electrical connection therebetween.

As the electronic device is mounted on the upper surface of the film contact, the electrode lands and the contact end portions on the upper surface of the film contact will touch each other without laterally inward displacement thereof, in contrast to the prior elastomer connectors. In addition, as the cover retains the electronic device compressing the elastomeric biassing sheet, the resiliency of the elastomeric biassing sheet will ensure sufficient contact pressure between the respective contact end portions and the electrode lands. Furthermore, as a result of the inherent thinness if the film contact, the above-board height of the socket connector itself is minimized.

Preferably, electrode bumps are formed on respective individual contact end portions to upstand therefrom assuring a more reliable connection between respective electrode lands and conductive paths.

Advantageously, the resiliently compressible biassing sheet comprises a series of individual, resilient projections which upstand from an upper surface thereof at predetermined spaced apart locations corresponding to respective locations of the individual contact end portions so that respective upper ends of respective individual projections engage respective locations of the lower surface of the film circuit which underlie respective individual contact end portions to provide individual contact pressure producing supports therefor.

Thus, the projections will support areas near the contact end portions of the conductive paths independently of each other, that is, independently of any deformation of adjacent projections.

This arrangement assures a uniform contact pressure between all contact end portions or electrode bumps and electrode lands.

It is further preferred that, the cover member comprises means for moving the electronic device relatively across the film contact while urging the electronic device into pressing engagement therewith thereby to produce a wiping action between respective individual electrode lands and respective individual contact end portions.

This wiping action both assists in removing contamination and improves the clinging or sealing action between the respective electrode lands and the respective contact end portions or bumps.

BRIEF DESCRIPTION OF THE DRAWINGS

Specific embodiments of the invention will now be described by way of example only and with reference to the accompanying drawing in which.

DESCRIPTION OF PARTICULAR EMBODIMENTS

Figure 1:
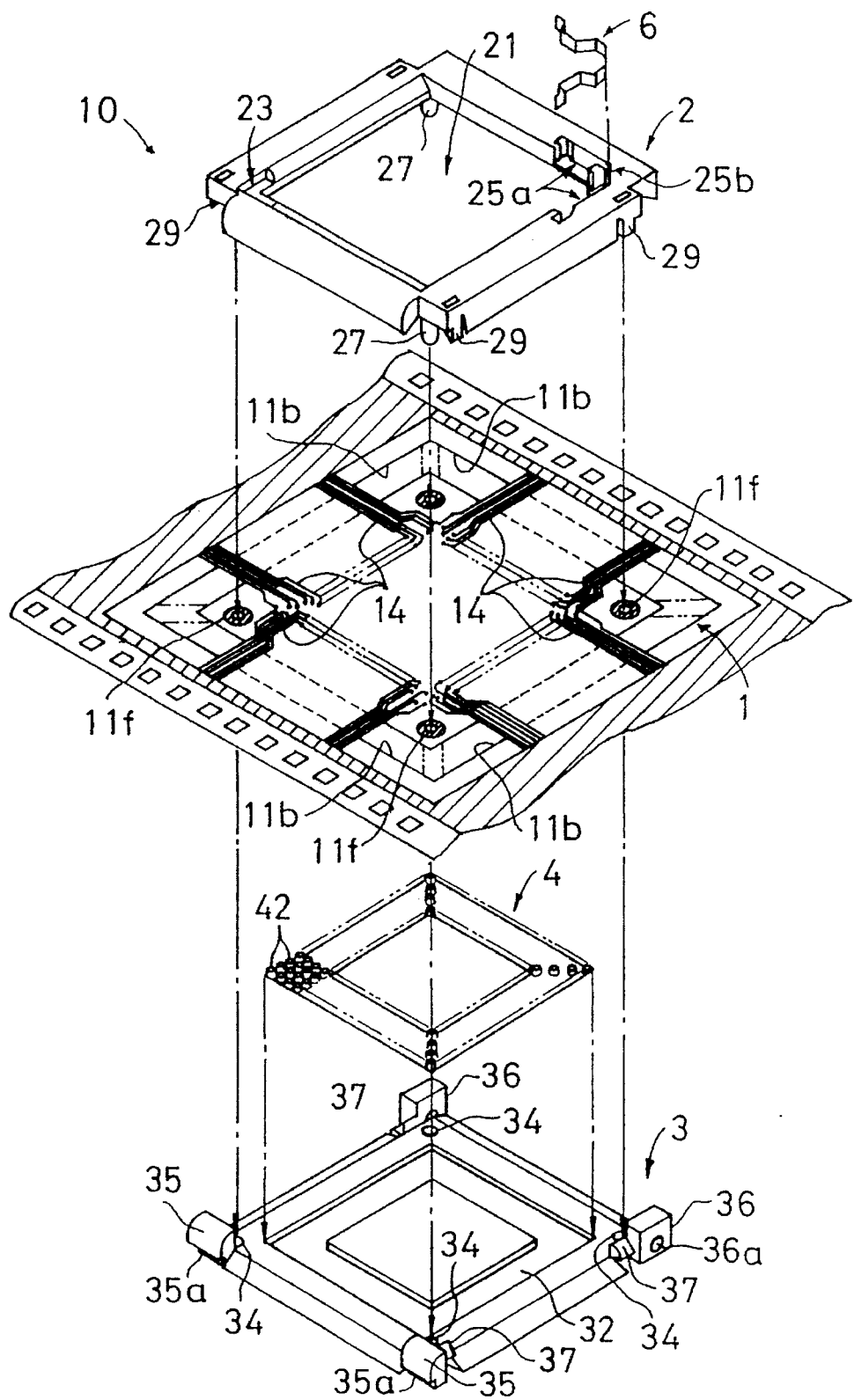
FIG. 1 is an exploded perspective view of a first embodiment of socket connector according to the invention, with a cover member thereof removed.
Figure 2:
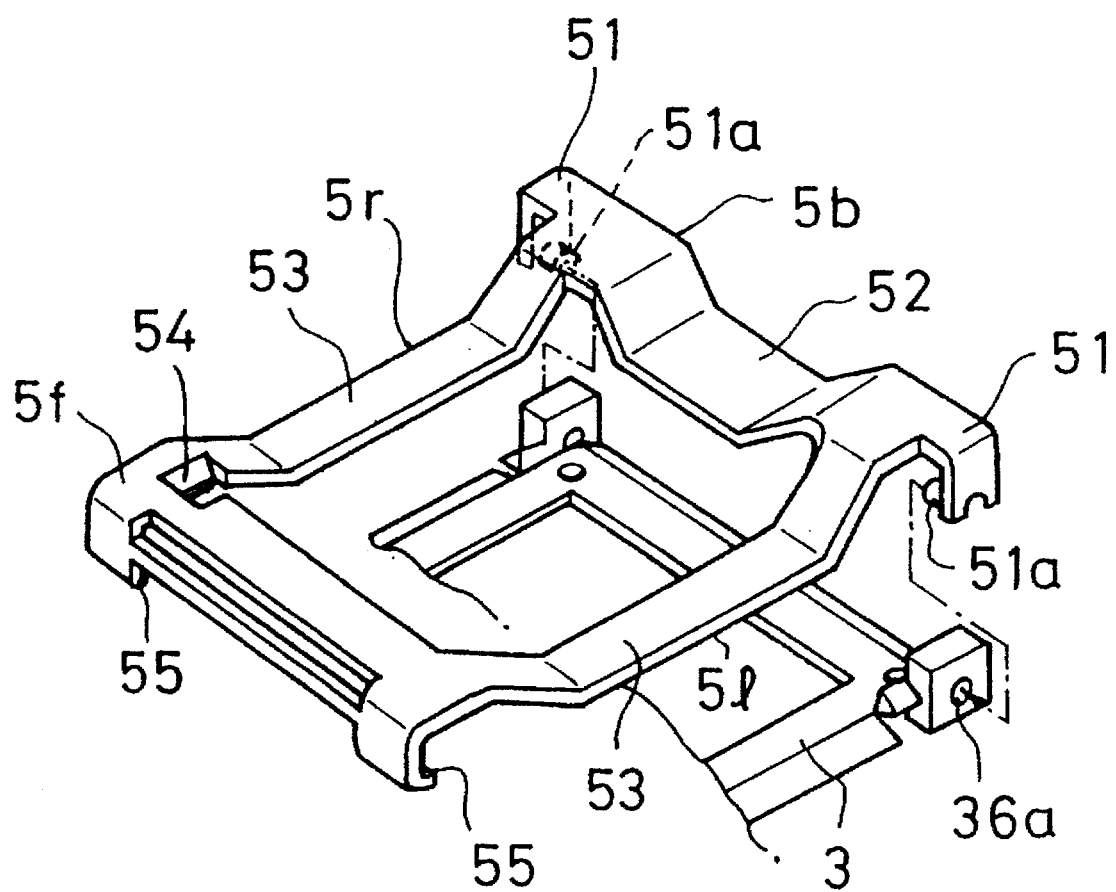
FIG. 2 is a fragmentary perspective view of the cover member of the socket connector shown in FIG. 1.

As shown in FIGS. 1 and 2, a first embodiment of socket connector 10 comprises a film contact 1, a frame member 2, a base member 3, an elastomeric biassing sheet 4, and a cover member 5.

Figure 3:
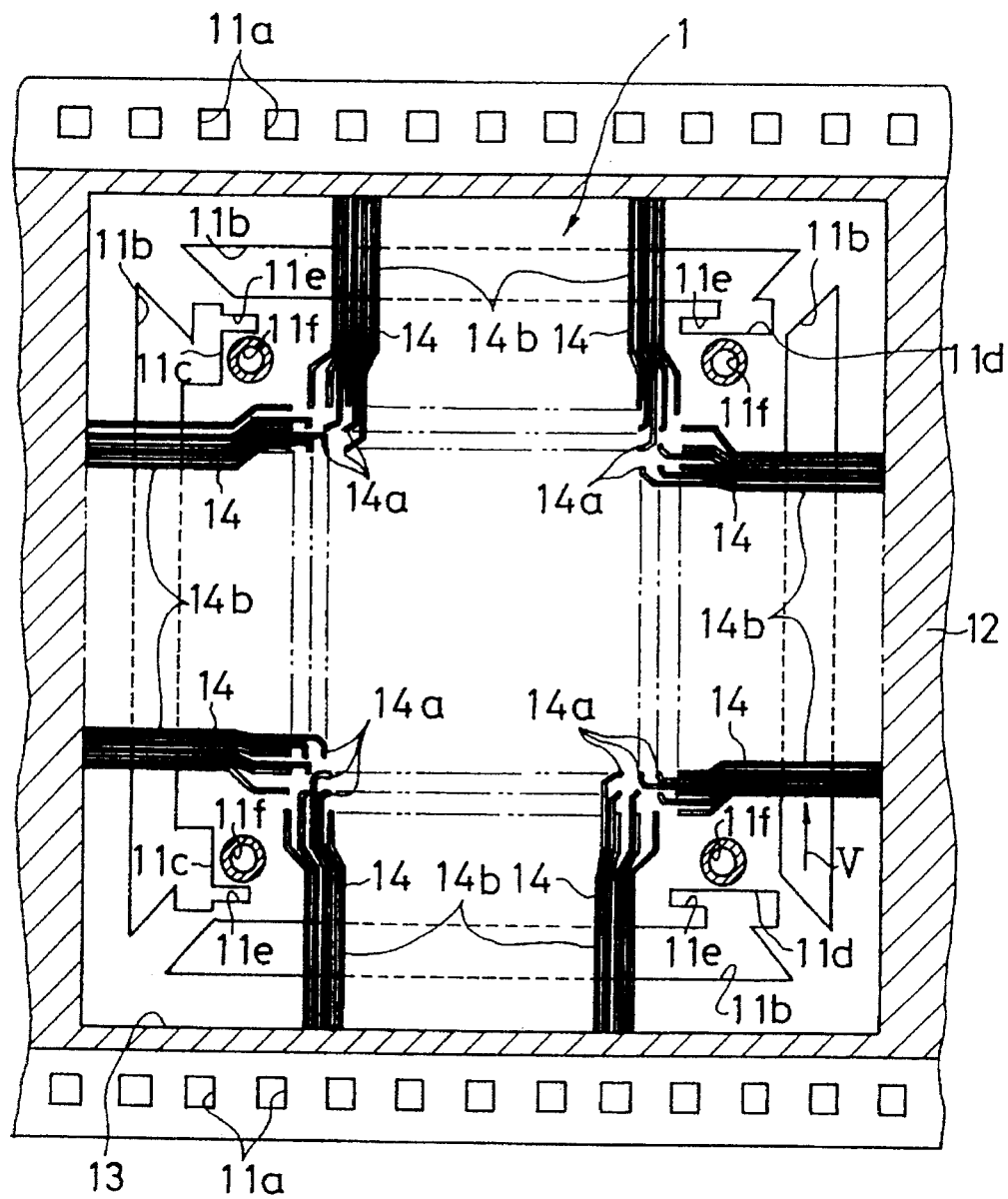
FIG. 3 is a plan view of a film contact of the socket connector shown in FIG. 1.

As shown in more detail in FIG. 3, the film contact 1 is formed on a carrier strip of insulating film 11 of synthetic resin or plastic having rows of indexing or sprocket receiving holes 11a formed on both longitudinally extending edge portions thereof. The film contact 1 is manufactured by firstly adhereing a thin copper foil 12 to the upper surface of the carrier 11 and then etching the copper foil 12 within a square area 13 at predetermined intervals to form numerous fine conductive paths or lead patterns 14, having respective contact end portions 14a arranged as three rows surrounding and enclosing a square, central portion of the square area 13 on all four sides so as to correspond with the layout of the electrode lands or pads on the lower surface of an LGA-type electronic device. Lead forming portions 14b of the conductive paths 14 extend outward to the outer perimeter of the square area 13.

Figure 4:
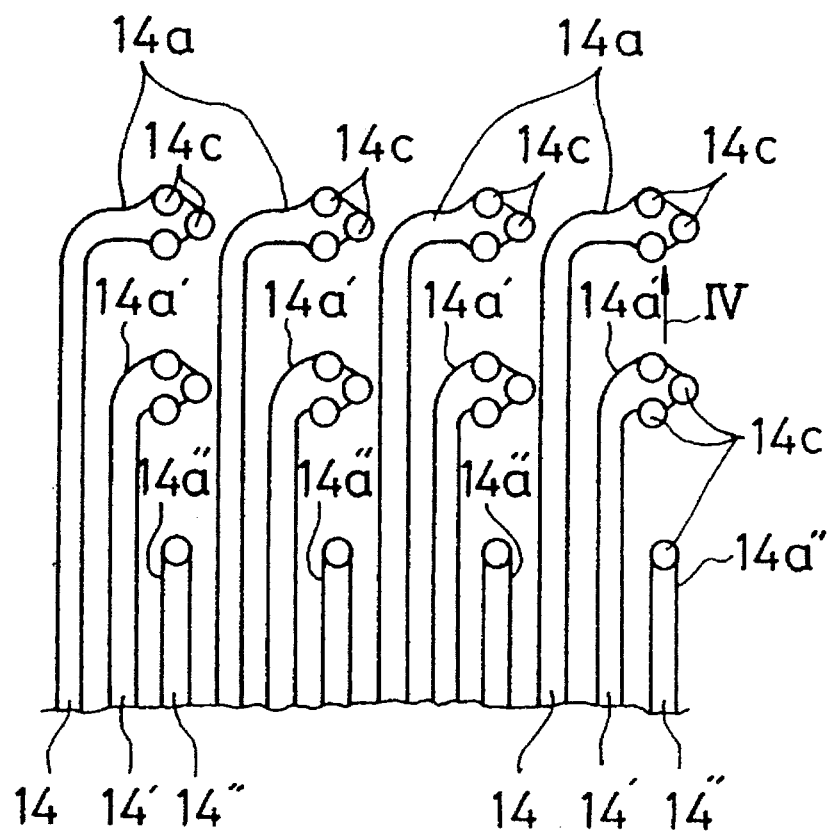
FIG. 4(A) is a fragmentary plan view to a greater scale, showing contact end portions of conductive paths of the aforementioned film contact.
FIG. 4(B) is a cross-sectional view along line IV—IV of FIG. 4(A)
Figure 4:
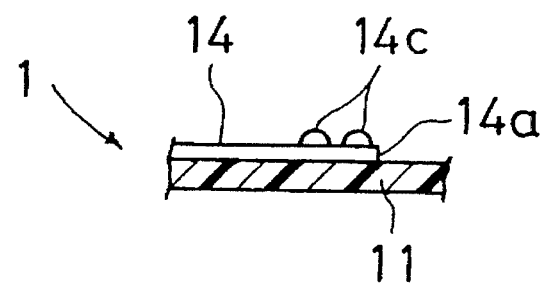

The innermost contact end portions 14a of the leads 14 are plated to form solid, hem-spherical electrode bumps 14c which upstand from the upper surface of the film contact 1, as shown in FIGS. 4 (A) and (B), with three bumps being formed on the inner contact end portion 14a ' of the innermost extending lead 14', comprising one on the innermost tip and two on adjacent sides. However, only a single bump 14c is formed on the inner contact end portion 14a " of the lead 14" which extends inward the least.

Figure 5:
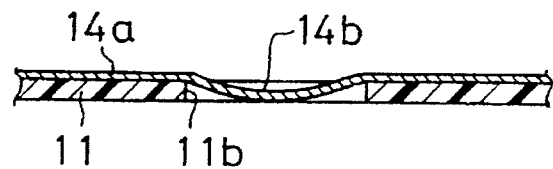
FIG. 5 is a cross-sectional view along line V—V of FIG. 3.

Four, spaced apart, strip-like portions are then removed from all four sides of the carrier strip 11 near the perimeter of the square area 13, as shown in FIG. 3, while leaving the four corners of the square area 13 intact, providing four through-apertures 11b which are bridged by lead forming portions 14b of the leads 14, as shown in FIG. 5. Access extensions 11c, 11d, 11e, respectively, communicate with the apertures 11b adjacent. positioning through-holes 11f which are each surrounded by a reinforcing ring of residual copper foil 12 and are formed in the four corners of the portion of the square area 13 surrounded by the through-apertures 11b. It will be appreciated that a series of film contacts 1 are formed by this technique at predetermined, spaced apart intervals along the carrier 11.

Figure 6:
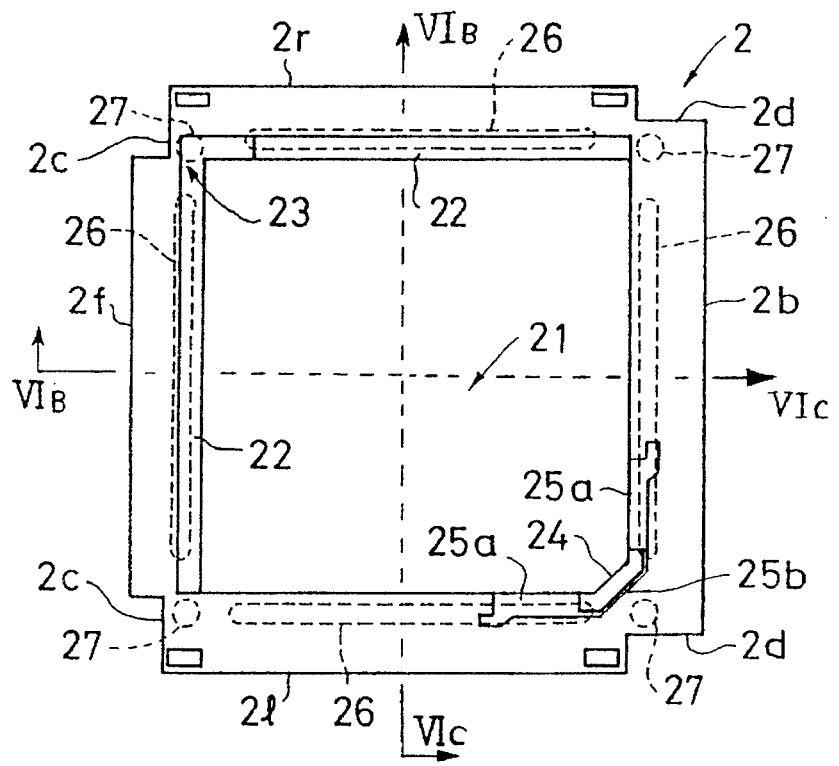
FIGS. 6(A), 6(B) and 6(C) are, respectively, plan and cross-sectional views of a frame member of the aforementioned socket connector, the cross-sectional views being taken along lines VIB—VIB and VIC—VIC, respectively, of FIG. 6(A), FIGS. 7(A), 7(B) and 7(C)are, respectively, plan and cross-sectional views of a base member of the aforementioned socket connector, the cross-sectional views being taken along lines VIIB—VIIB and VIIC—VIIC, respectively, of FIG. 7(A)
Figure 6:
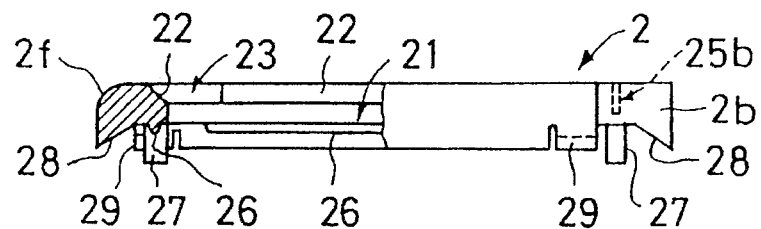
Figure 6:
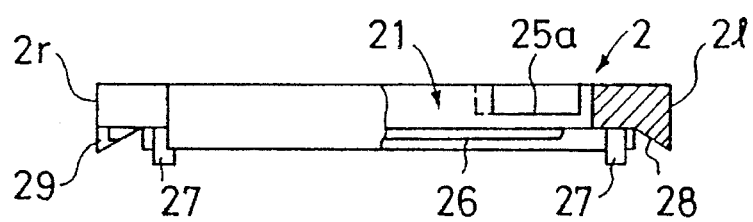

The frame member 2 is molded in one piece of plastic or metal and is rectangular in plan, as shown in FIG. 6 (A), having front, rear, right and left walls 2f, 2b, 2r and 2c, respectively, joined at ends to define between them a square, device-receiving through-aperture 21. As shown in FIG. 6 (B), guiding portions 22 providing upper device guiding surfaces which incline downwards to the device-receiving opening 21 are formed in inwardly facing, upper portions of the front and right walls, 2f and 2r, respectively. The guiding portions 22 are rebated at locations adjacent the corner formed by the junction of the right side and the front wall providing vertical faces defining between them a detent-receiving space 23. The front wall has a convex external and upward facing surface. Rebates 2c which open forwards and laterally are formed in the left end and right end walls of the front wall 2, and rebates 2d which open rearward and laterally are formed in the rear ends of the left and right walls 2l and 2r.

As shown in FIG. 6 (A), an inward facing, device abutting, surface portion 24 is formed extending obliquely at 45 degrees across the corner defined by the rear and left walls. Spring receiving recesses or seats 25a which open upwards and inwards are formed in the parts adjacent surface 24 in the rear and right walls 2b and 2l, respectively, and are interconnected by a spring anchoring slit 25b formed, opening upward, behind the surface portion 24. Remote ends of the respective recesses 25a are formed with spring anchoring undercuts.

Figure 13:
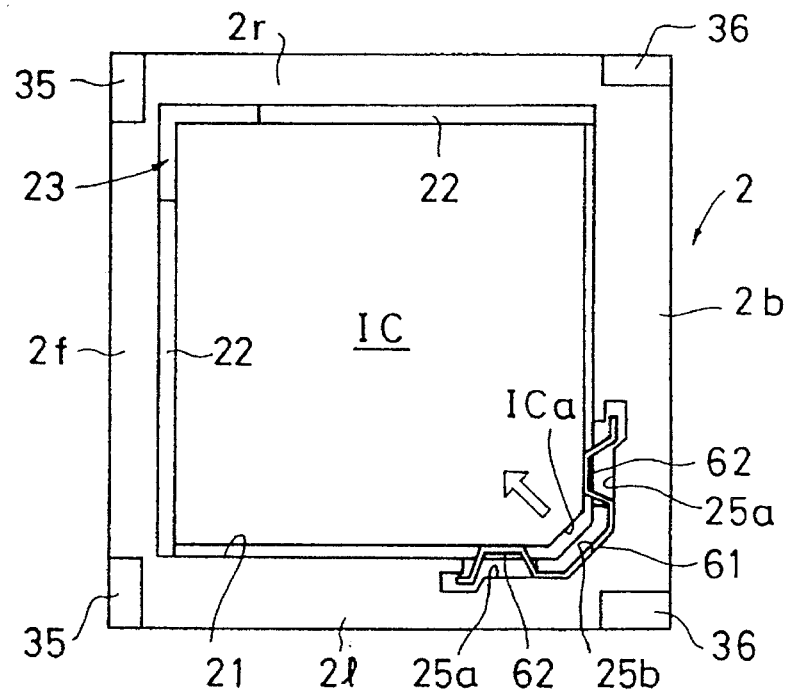
FIGS. 13(A) and 13(B) are plan views showing an electronic device received in the aforementioned frame member before and after assembly and closure of the cover member, respectively.
Figure 13:
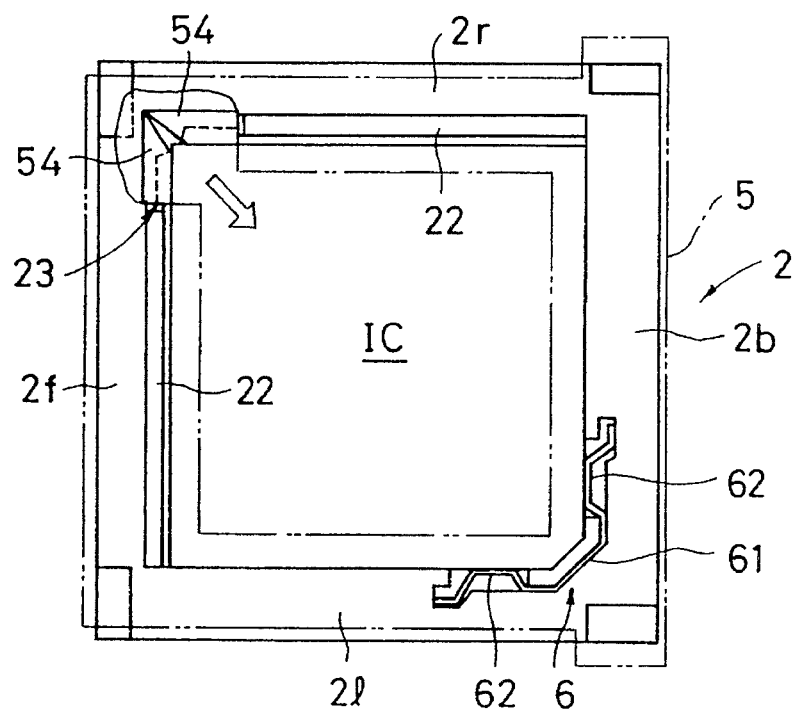

As shown in FIGS. 1 and 13, a spring 6 for insertion in the recesses 25a and slit 25b is formed from a metal strip and is of generally U-shape in undeformed condition having a concave medial anchoring portion 61 which is pressed into the slit 25b from above and convex, device engaging portions 62 on respective ends thereof which seat in the recesses 25a, with free ends anchored in the respective undercut anchoring portions so that the device engaging portions protrude within the periphery of the device-receiving opening 21.

Surfaces of inner, longitudinally extending edge portions of the undersides of the front, rear, left and right walls 2f, 2b, 2l and 2r, respectively, are horizontal, as shown in FIGS. 6 (B) and 6 (C), and longitudinally extending clamping ribs 26 protrude downward from central locations thereof. Cylindrical positioning pegs 27 are formed to project downwards in the four corners of the underside. Surfaces of respective outer edge portions 28 of the undersides of the all four walls incline downwards as they extend outward. Resilient latches 29 having respective inward extending claws are formed at respective opposite ends of the left and right walls 2l and 2r, respectively.

As shown in FIG. 7(A), the base member 3 is a metal plate, generally rectangular in plan and has an upper surface 31 formed with a shallow, square, biassing sheet receiving channel 32 and front, rear, left and right peripheral edge portions, 3f, 3b, 3l and 3r, respectively, which taper outward providing respective downward inclined upper surfaces 33.

Vertically extending, positioning peg receiving apertures 34 are formed adjacent the four corners of the upper surface 31.

Figure 7:
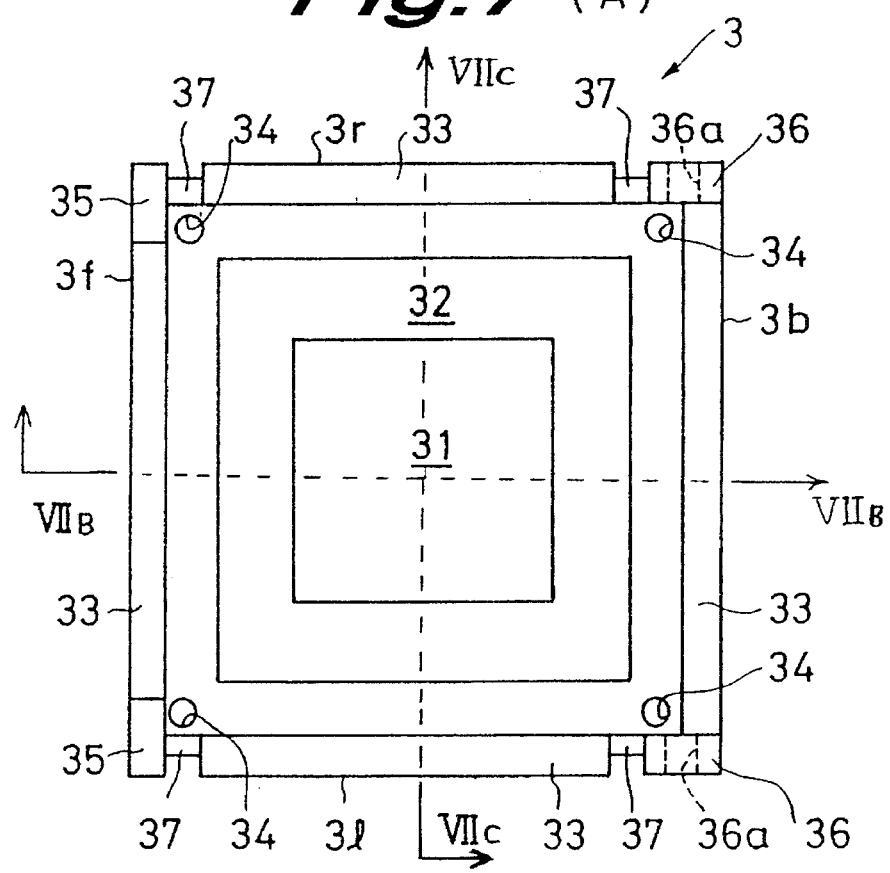
Figure 7:
Figure 7:
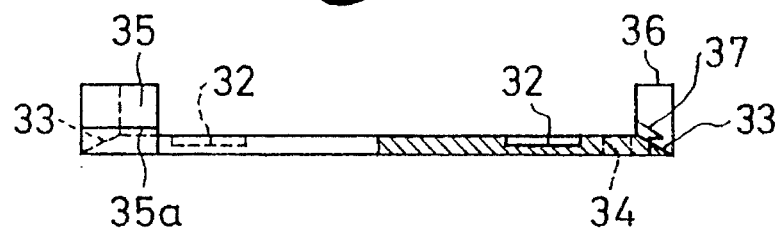

Longitudinally extending hooks 35, 35, which have upper and forward facing convex surface portions and undercut notches 35a, are formed at respective opposite ends of the front edge portion 3f to protrude upwards from the upper surface 31, as shown in FIG. 7 (B). Notches 35a which open forwards and downwards are formed in front surfaces of the lower parts of the hooks 35.

Supporting pillars 36 upstand from the upper surface 31 at respective rear ends of the left and right edge portions 3l and 3r, respectively, and cover member mounting sockets 36a pass horizontally therethrough.

Latches 37 are formed on the left and right edge portions 3r and 3l, adjacent the pillars and hooks to upstand a small distance above the upper surface 31, positioned for latching engagement with the respective claws 29 of the frame member 2.

Figure 8:
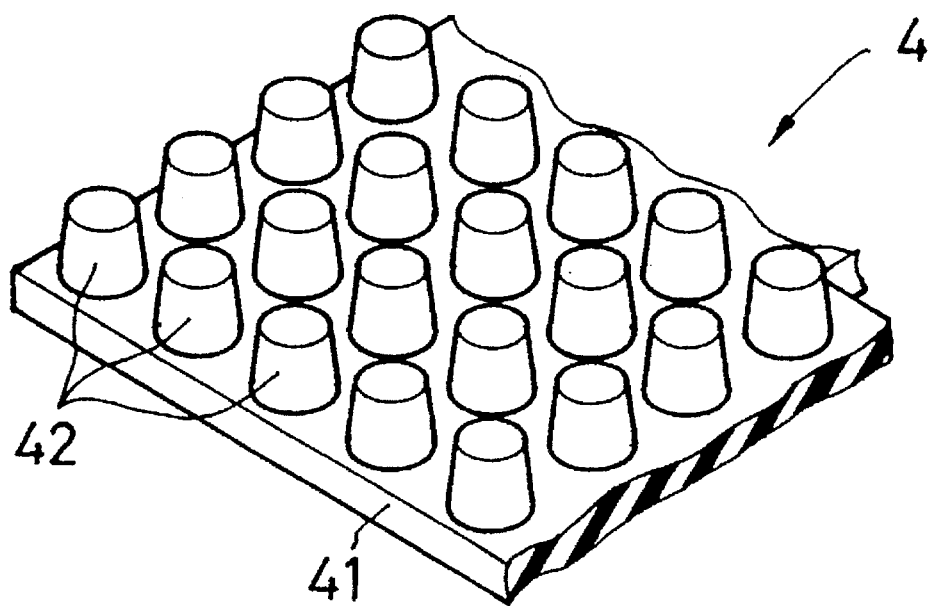
FIG. 8 is a fragmentary perspective view to a greater scale of an elastomeric biassing sheet of the aforementioned socket connector.

The elastomeric biassing sheet 4 is molded from an elastomeric material such as rubber, and, as shown in FIG. 8, consists of a thin basal layer or sheet portion 41, shaped as a square ring, in plan, from which a series of resiliently compressible, frusto-conical projections 42, upstand in predetermined spaced relation so that all respective individual contact end portions 14a are supported by respective individual projections which engage precisely underlying locations of the lower surface of the film, as shown in FIG. 11(B). In an alternative construction, the projections are closely spaced in random array so that although precise alignment is not always obtained, the projections provide sufficient independent support for the contact end portions.

As shown in FIG. 2, the cover member 5 is stamped and formed as a single piece of metal and comprises a framework, rectangular in plan, with front, rear, right and left limbs, 5f, 5b, 5r and 5l, respectively. Catch portions 51 comprise tabs which extend laterally and have downward bent free ends which carry inwardly directed, upwardly convex, hemi-cylindrical pivot pins 51a for receipt in the sockets 36a of the base member pivotally to mount the cover member thereon. The rear, and both right and left limbs are depressed at central locations to provide stiffly resilient device pressing portions 52, and 53, respectively, and hook form, mounting extensions 55 extend downwards and rearward at respective opposite ends of the front wall 5f as continuations of the left and right walls 5l and 5r.

Figure 9:
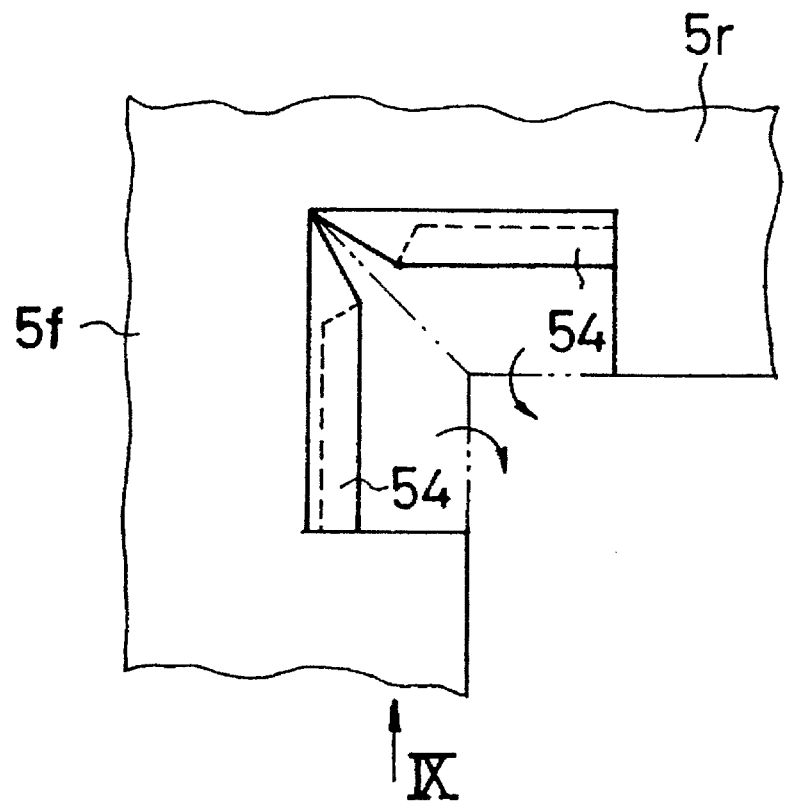
FIGS. 9(A) and 9(B) are, respectively, fragmentary plan and cross-sectional views of the aforementioned cover member; the cross-sectional view being taken along line IX—IX of FIG. 9(A)
Figure 9:
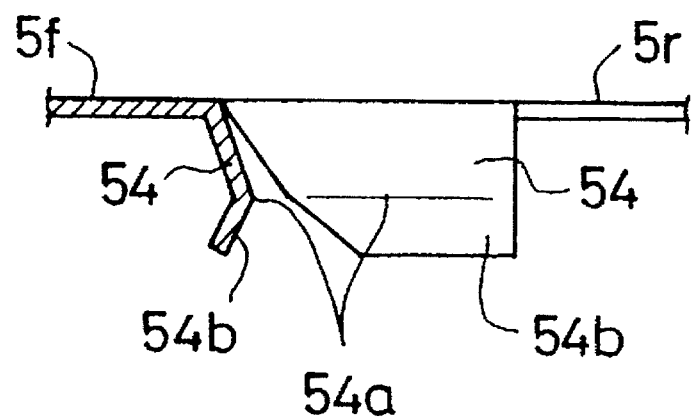

A pair of device moving detents 54 are formed within the corner defined by the front wall 5f and the right wall 5r, as shown in FIGS. 9(A) and 9(B). These detents are formed by cutting the stock diagonally along the chain line and perpendicularly, into the right and front walls at locations spaced rearward and leftward from the diagonal cut, and bending the tongues so formed downwards to provide medial portions 54a which incline downward and inwards and reversely bent end portions 54b.

The socket connector 10 is assembled by aligning the frame member 2 and the base member 3 above and below the film contact 1, respectively, as shown in FIG. 1, with the elastomeric biassing sheet 4 seated in the channel shaped recess 32 of the base member 3, and urging them together into latching engagement about the film contact. During such engagement the hooks 35 and pillars 36 of the base member 3 pass through the access extension apertures 11c and 11d, respectively, in the film contact 1, and seat in the rebates 2c and 2d, respectively, in the front and rear walls 2f and 2b of the frame member 2. At the same time, the positioning pegs 27 of the frame member 2 are inserted through the positioning through holes 11f of the film contact 1 into the peg receiving sockets 34 of the base member 3 to protrude downward from the lower surface of the base member 3, (see FIG. 12) and the latches 29 of the frame member 2 are inserted through the access extension apertures 11e and engage in a snap action with the fixed latches 37 of the base member 3, firmly connecting the frame and base members together.

Figure 10:
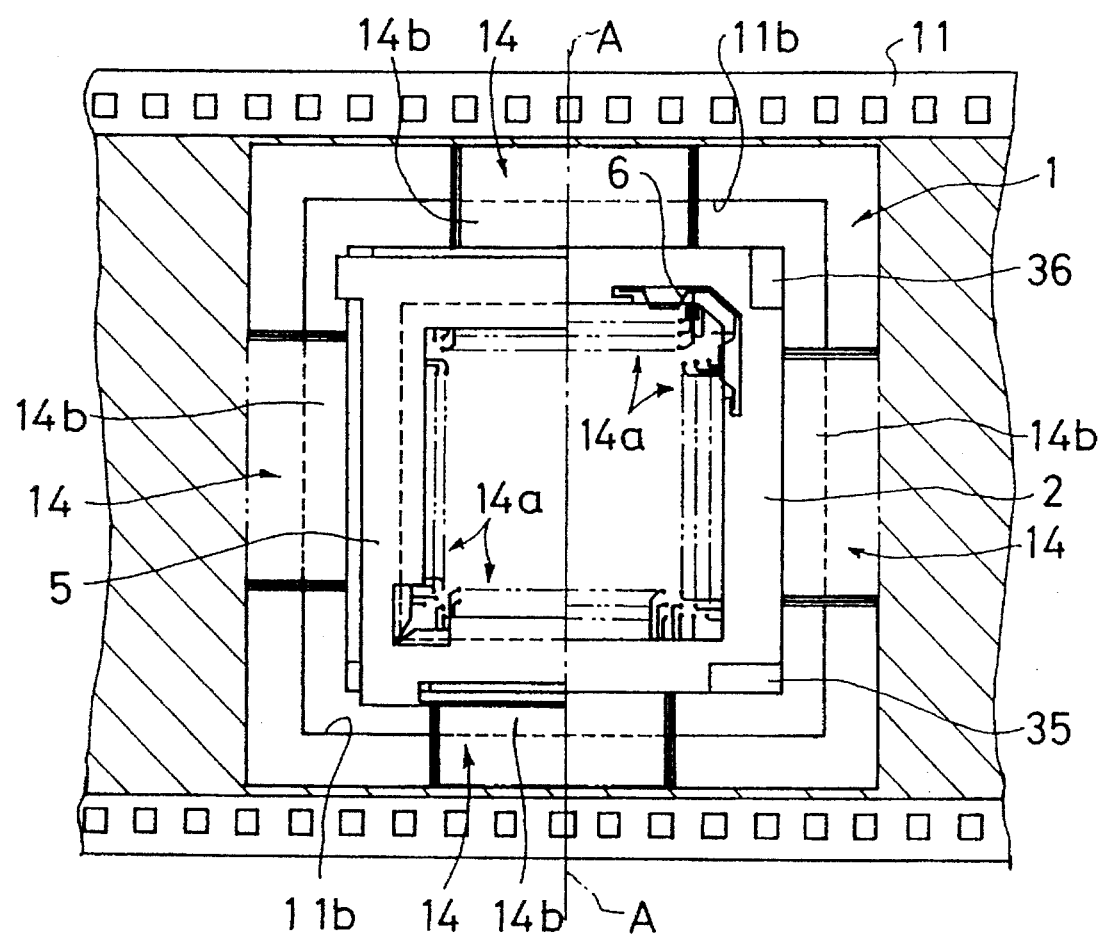
FIG. 10 is a plan view, split medially into two different horizontal planes, of the aforementioned socket connector connector, fully assembled.

As shown on the right side of the section line A—A in FIG. 10, the inner contact end portion 14a of each lead 14 of the film contact 1 extends inside the device-receiving aperture 21 of the frame member 2. The upper surfaces of the projections 42 of the elastomeric biassing sheet 4 are in supporting engagement with locations of the film underlying respective corresponding inner contact end portions 14a of the conductive paths, while adjacent portions of the conductive paths are clamped against the upper surface 31 of the base member 3 by the clamping ribs 26 of the frame member, as shown in FIG. 11(A), and outwardly extending portions are enclosed between the inclined surfaces 28 and 33, respectively, of the frame member 2 and the base member 3 so that they are angled downward with the board connecting portions extending horizontally across the apertures 11b extend horizontally beyond the peripheries of both frame and base members with their lower surfaces at the same height as the lower surface of the base member 3.

The pivot pins 51a of the cover member 5 are then inserted into the sockets 36a of the base member 3 thereby attaching the cover member for pivotal opening and closing movement above the frame member (see the left side of the section line A in FIG. 10). Thus, the assembly of the socket connector 10 is completed while it is held by the carrier strip 11. Furthermore, during the assembly, the film bridges in the four corners of the film contact 1 are removed so that the apertures 11b intercommunicated completely to form a single rectangular aperture with the result that the socket connector 10 is supported on the carrier strip 11 only by the conductive paths or leads 14.

Figure 11:
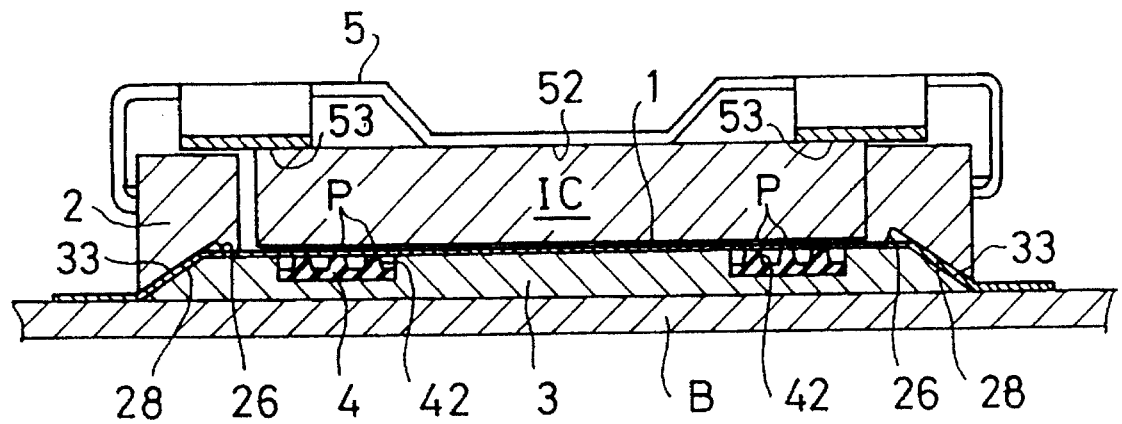
FIG. 11(A) is side cross-sectional view of the aforementioned socket connector assembled on a circuit board.
FIG. 11(B) is similar view to FIG. 11(A), to a larger scale, of a portion of the assembled socket connector (A).
Figure 11:
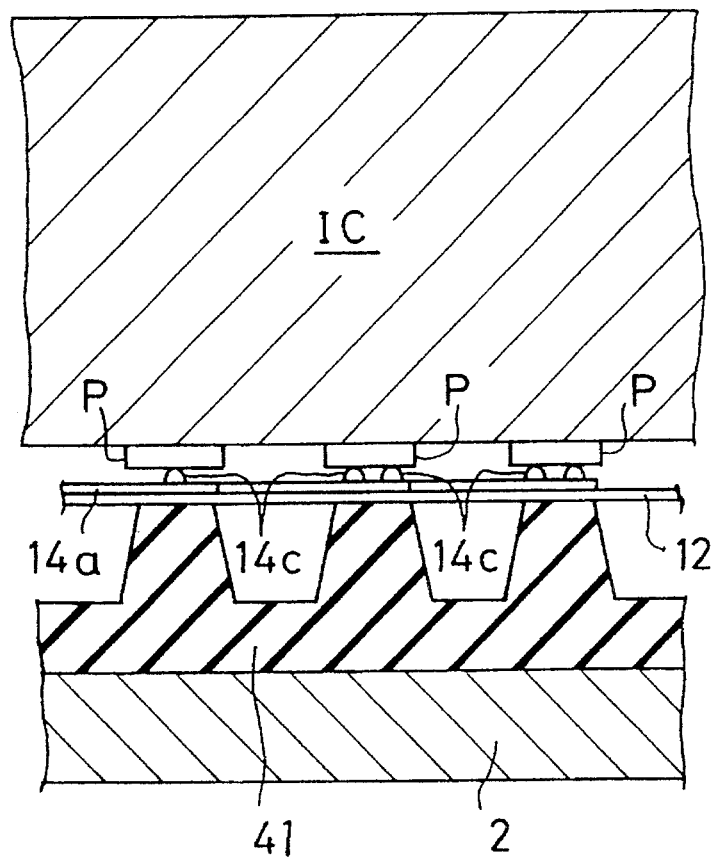
Figure 12:
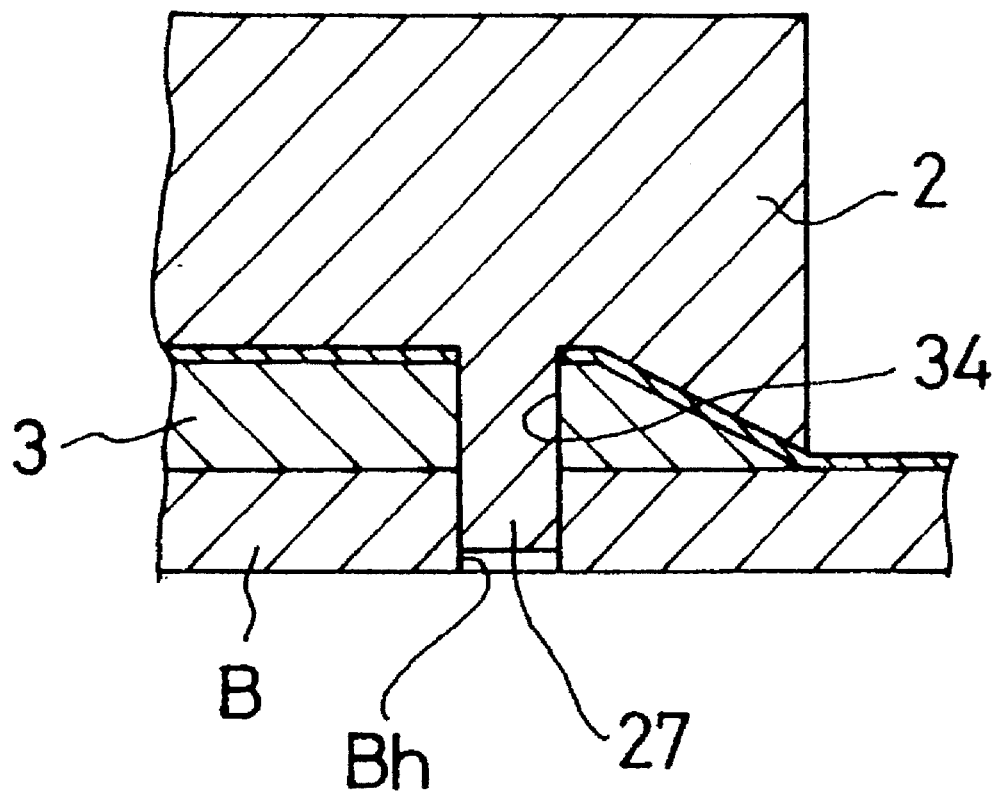
FIG. 12 is a fragmentary cross-sectional view showing the aforementioned assembled socket connector attached to a circuit board.

In order to mount the socket connector, thus assembled, on a circuit board, the film contact 1 is first punched out of the carrier strip 11 and the socket connector 10 is cut from the carrier strip 11 and the positioning pegs 27 are inserted into the hole Bh formed in the board B, as shown in FIG. 12. As shown in FIG. 11 (A), the undersides of board connecting portions 14b of the conductive paths or leads which protrude horizontally beyond the outside of the base member 3 are soldered to a wiring pattern (not shown in the figure) formed on the board B. Subsequently, the superfluous lengths of conductive paths or leads extending beyond the soldered areas are trimmed away.

As the frame member 2 and the base member 3 can be formed from metal with high rigidities, it is not necessary to install reinforcing plates etc. on the rear surface of the board B.

As shown in FIG. 13 (A), an LGA-type electronic device IC is inserted into the device-receiving opening 21 of the socket connector 10 mounted on the board B with the beveled part ICa of the electronic device IC facing the device abutting surface 24 of the frame member 2 obviating risk of insertion in an incorrect direction. The device engaging portions 62 of the spring installed on the frame member 2 engage the left and rear surfaces of the inserted electronic device IC, biassing the device in the direction of the outlined arrow so that the right side and front surfaces thereof abut the inner surfaces of the guiding portions 22.

Closing the cover member 5 causes the pressing portions 52, 53 thereof to force the electronic device down and the mounting hooks 55 to snap into locking engagement with the cut-out 35a of the base member 3, clamping the device against the upper surface of the film contact 1 so that, as shown in FIG. 11 (B), the bumps 14c formed on the contact end portions of the leads 14 engage the electrode lands P, P, on the bottom of the electronic device (for example an integrated circuit) and are pushed against the electrode lands P by the resiling action of the projections 42 of the elastomeric biassing sheet 4.

The compression of one projection 42 does not adversely affect the performance of an adjacent projection 42 as the projections engage the surface of the film underlying the contact portions of the conductive paths independently. Therefore, substantially the same contact pressures are provided between all individual electrode lands P and bumps 14c.

As shown in FIG. 13 (B), during closing of the cover member, the two detents 54 enter the recess 23 of the frame member 2 and are brought progressively into engagement with the right and front sides of the electronic device with a camming action which moves the device horizontally in the direction of the arrow back so that the left and rear sides abut the inner surfaces of the right and rear walls 2r and 2b of the frame member 2. The electrode lands P are moved across the bumps 14c by this motion and a wiping effect can be obtained, which makes them contact each other more tightly.

The electronic device mounted on the socket connector 10 is operated by the input of electric signals through the leads 14 from the wiring patterns on the board B. As the frame and base members 2 and 3, respectively, can be formed from metals with high thermal conductivity, they radiate heat from the electronic device.

Release and removal of the device can be simply achieved by opening the cover member 5 by prizing back the hooks 55 from the cover member cut-out 35a.

Figure 14:
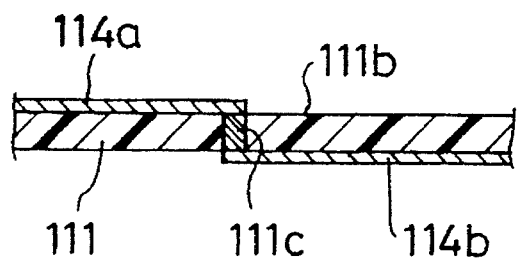
FIG. 14 is a side cross-sectional view showing a second embodiment of film contact.

In the first embodiment described above, outer, board connecting portions 14b of the leads 14 of the flexible printed board 1 extend along the upper surface of the carrier strip 11, but as shown in FIG. 14, it is also possible to make such portions 114b extend along the lower surface of the carrier 111. In this case, a plated through-hole 111c connects an inner, contact portion 114a of the lead 114 which extends along the upper surface of the carrier 111 to the aforementioned outer board connecting portion 114b, is formed on the inner surface portions previously removed to form the apertures 11b. Furthermore, by so doing so, the base end 114b of the lead 114 is reinforced by the carrier 111, advantageously increasing the strength.

Figure 15:
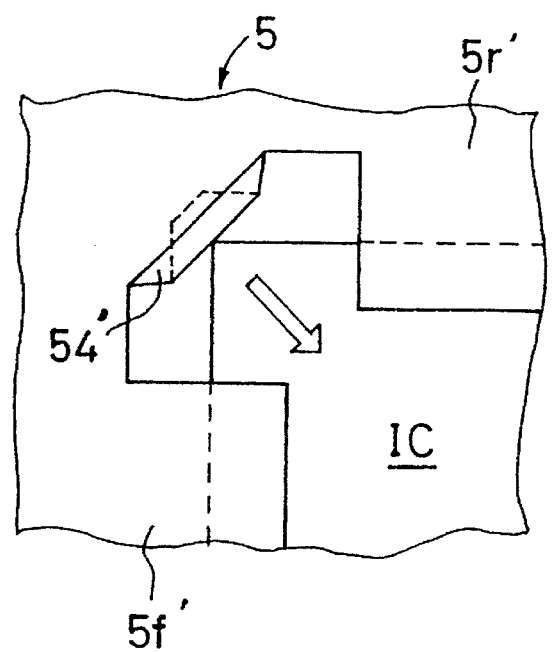
FIG. 15 is a plan view showing a second showing a second embodiment of cover member.

In addition, the two device moving detents 54a may be replaced by a single device moving detent 54' shown in FIG. 15, which extends at an angle of 45 degrees with respect to the longitudinal directions of the right wall 5r' and the front wall 5f'. In this case, the device moving detent 54' abuts the right front corner of the electronic device IC moving it in the same direction (shown by the arrow) and applying a similar biassing force to that of the first example providing the wiping effect.

It will be apparent that, as a result of employing an etching technique to form the individual contacts, the manufacturing operation is much simpler than for socket connectors which utilize contact pins while the use of a film contact enables the above-board height to be minimized when the electronic device is mounted on the board. The provision of the electrode bumps on the inner contact end portions of the lead patterns improves the reliability of the individual electrical connections, while the provision of the individual projections supporting areas adjacent to the inner contact end portions of the conductive paths independently of adjacent supported areas affords a uniform contact pressure between all of the conductive paths (bumps) and the electrode lands. The wiping action both assists in removing contamination and improves sealing engagement or adhesion between the respective electrode lands and the respective contact end portions or bumps.

I claim:

1. A socket connector for mounting an electronic device of a type having a series of individual electrode lands at predetermined spaced apart locations on a lower, contact surface thereof, on a circuit board comprising:

a film contact comprising an insulating film having upper and lower surfaces and carrying a series of conductive paths with respective board connecting portions extending away from respective individual contact end portions which are located on the upper surface at predetermined spaced apart locations corresponding to the respective locations individual electrode lands;

base means located under the lower surface of the contact in supporting relation thereto;

a resiliently compressible biassing sheet located on the base means so as to underlie at least the contact end portions of the film contact, and, cover means for engagement with an upper surface of the electronic device to retain the electronic device pressed against the upper surface of the film circuit with resilient compression of the biassing sheet urging respective individual contact end portions of the conductive paths against respective individual electrode lands with sufficient contact pressure to ensure reliable electrical connection therebetween, the cover means comprising means for moving the electronic device relatively across the film contact while urging the electronic device into pressing engagement therewith thereby to produce a wiping action between respective individual electrodes lands and respective individual contact end portions.

2. A socket connector according to claim 1 wherein electrode bumps are formed on respective individual contact end portions to upstand therefrom for engagement with electrode lands.

3. A socket connector according to claim 1, wherein the resiliently compressible biassing sheet comprises a series of individual resilient projections which upstand from an upper surface thereof at closely spaced apart locations so that respective upper ends of respective individual projections engage respective locations of the lower surface of the film circuit which are adjacent respective individual contact end portions to provide individual contact pressure producing supports therefor.

4. A socket connector according to claim 2, wherein the resiliently compressible biassing sheet comprises a series of individual resilient projections which upstand from an upper surface thereof at closely spaced apart locations so that respective upper ends of respective individual projections engage respective locations of the lower surface of the film circuit which are adjacent respective individual contact end portions to provide individual contact pressure producing supports therefor.

5. A socket connector for mounting an electronic device of a type having a series of individual electrode lands at predetermined spaced apart locations on a lower, contact surface thereof, on a circuit board comprising:

a film contact comprising an insulating film having first and second, opposite surfaces and carrying a series of conductive paths comprising respective individual contact end portions which are located in the first surface at predetermined inner, spaced apart locations corresponding to the respective locations of the individual electrode lands and respective beard connecting portions extending outwardly, away from respective contact end portions;

a resiliently compressible, flat, film contact biassing pad; and, a socket housing comprising:

means for mounting the socket housing on the circuit board;

an inner, socket forming cavity;

means mounting the film, contact in the housing with the inner locations carrying the individual contact end portions extending across the cavity and respective board engaging portions extending out of the housing; and means for retaining the electronic device and the film contact biassing pad in the cavity on respective opposite surfaces of the film circuit, with the contact biassing pad in resiliently compressed engagement with the second surface of the film circuit thereby pressing respective individual contact end portions of the conductive paths against respective individual electrode lands to establish reliable electrical connection therebetween, the retaining means comprising a cover member releasably secured to the housing and comprising means for moving the electronic device relatively across the film contact while urging the electronic device into pressing engagement therewith thereby to produce a wiping action between respective individual electrode lands and respective individual contact end portions.

6. A socket connector according to claim 5, wherein electrode bumps are formed on respective individual contact end portions to upstand therefrom for engagement with electrode lands.

7. A socket connector according to claim 5, wherein the film contact biassing pad, comprises a series of individual resilient projections which upstand from an upper surface thereof at closely spaced apart locations so that respective upper ends of respective individual projections engage respective locations of the lower surface of the film circuit which are adjacent respective individual contact end portions to provide individual contact pressure producing supports therefor.

8. A socket connector according to claim 6 wherein the film contact biassing pad, comprises a series of individual resilient projections which upstand from an upper surface thereof at closely spaced apart locations so that respective upper ends of respective individual projections engage respective locations of the lower surface of the film circuit which are adjacent respective individual contact end portions to provide individual contact pressure producing supports therefor.

9. A socket connector according to claim 6 wherein the housing comprises a base member and a frame member formed, respectively, with a film contact biassing pad receiving cavity portion and an electronic device receiving cavity portion and interengageable to clamp between them the film circuit with the respective cavity portions aligned to form the inner cavity.

10. A socket connector according to claim 7 wherein the cover member is connected to the frame member for pivotal movement between open, electronic device admitting, and closed electronic device retaining positions and the moving means comprises a cam member on the cover member which is brought progressively into engagement with a side of the electronic device during pivotal movement to the closed position, thereby to move the electronic device relatively across the film contact.

11. A socket connector according to claim 10 wherein the cover member is stamped and formed from sheet metal and the cam member is formed by a detent thereof.

* * * * *